United States Patent [19]
Okuhara et al.

[11] 3,891,866
[45] June 24, 1975

[54] HIGHLY SENSITIVE GATE-CONTROLLED PNPN SWITCHING CIRCUIT

[75] Inventors: Shinzi Okuhara, Fujisawa; Masaaki Kusano; Mitsuru Kawanami, both of Yokohama, all of Japan

[73] Assignee: Hitachi, Ltd., Japan

[22] Filed: June 28, 1974

[21] Appl. No.: 484,238

[30] Foreign Application Priority Data
July 2, 1973 Japan ................................ 48-73725

[52] U.S. Cl. .......... 307/252 A; 307/202; 307/252 C; 307/304; 307/305
[51] Int. Cl. ....................... H03k 17/16; H03k 17//72
[58] Field of Search ............ 307/202, 252 A, 252 C, 307/304, 305; 357/38

[56] References Cited
UNITED STATES PATENTS

| | | | |
|---|---|---|---|
| 3,265,909 | 8/1966 | Gentry | 307/305 X |
| 3,404,293 | 10/1968 | Harris et al. | 307/305 X |
| 3,609,413 | 9/1971 | Lane et al. | 307/305 |
| 3,812,405 | 5/1974 | Clark | 307/252 A |

*Primary Examiner*—Michael J. Lynch
*Assistant Examiner*—L. N. Anagnos
*Attorney, Agent, or Firm*—Craig & Antonelli

[57] ABSTRACT

A PNPN switch having substantially a fourlayer structure has at least its first, third and fourth layers, which have respectively P,P and N conductivity types, provided respectively with a first, third and fourth electrodes. The source and the drain of a field effect transistor is connected with the third and fourth electrodes, respectively. The third electrode is further connected with one end of a voltage drop element while the other end of the voltage drop element is connected with the gate of the field effect transistor. The gate of the field effect transistor and the other end of the voltage drop element, connected together, serve as a gate trigger terminal of a highly sensitive gate-controlled PNPN switching circuit.

8 Claims, 9 Drawing Figures

HIGHLY SENSITIVE GATE-CONTROLLED PNPN SWITCHING CIRCUIT

The present invention relates to a gate-controlled PNPN switching circuit having high stability as well as high sensitivity.

With a gate-controlled PNPN switching circuit, a comparatively large current can be controlled with a small gate current and moreover the switch can be turned on by applying a pulse current having a short duration to the gate so that the load or main current continues to flow through the device until the load current is interrupted by another means. In other words, the PNPN switch has a function of a memory element and therefore is used widely in the fields of power transmission and communications, known under the name of thyristor or SCR.

However, if a step voltage i.e., a voltage having a short rising time, is applied between the electrodes (anode and cathode), the gate-controlled PNPN switch tends to be fired into erroneous conduction, quite independently of gating control. And a means provided to prevent such an adverse firing is accompanied by a necessary drawback of poor gating sensitivity.

It is therefore the main object of the present invention to provide a gate-controlled PNPN switching circuit which has a high sensitivity as well as a high stability and which can be turned off by controlling the gating signal if some circuit constants are appropriately adjusted.

Other objects, features and advantages of the present invention will be apparent from the following description of the preferred embodiments of the invention, referring to the accompanying drawings in which:

FIGS. 1*a*, 1*b* and 1*c* show the basic structures of several conventional PNPN switches;

FIGS. 2*a* and 2*b* show conventional PNPN switching circuits;

Prior to the concrete explanation of the present invention, the principle structure of a PNPN switch and a conventional gate-controlled PNPN switching circuit provided with a circuit for preventing erroneous firing will be described with the aid of FIGS. 1*a*, 1*b* and 1*c* and FIGS. 2*a* and 2*b*.

Figure 1A:
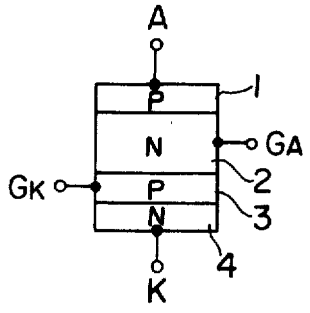
FIG. 1a PRIOR ART

FIG. 1*a* shows a schematic structure of a PNPN switch used as a circuit element in a power PNPN switching circuit, the PNPN switch having P, N, P and N layers. Of the four layers P, N, P and N, the first is called anode A, the second anode gate GA, the third cathode gate GK, and the fourth cathode K. If a voltage is applied to the PNPN switch with the anode A maintained at positive potential with respect to the cathode K and if current is injected into the cathode gate GK or drawn from the anode gate GA, then a conduction path is established between the anode A and cathode K, the impedance of the path being low and the voltage drop across it being small. And even if the gate current is interrupted, the conductive state is maintained. Here, the current tending from the cathode K toward the anode A is blocked.

Figure 1B:
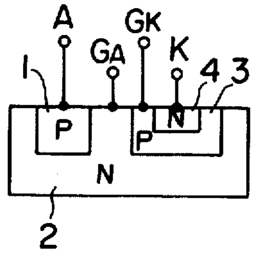
FIG. 1b PRIOR ART

FIG. 1*b* is a cross section of a model of a PNPN switch fabricated in the form of an integrated device, with its four terminals A, GA, GK and K on the same surface.

Figure 1C:
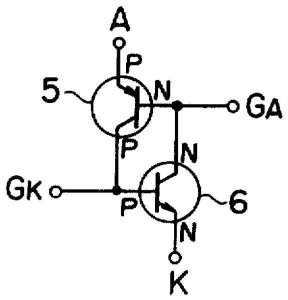
FIG. 1c PRIOR ART

FIG. 1*c* shows a PNPN switch constructed by combining a PNP transistor 5 and an NPN transistor 6 through wiring.

As described above, the PNPN switch itself may have several different structures but they can be reduced equivalently to the one shown in FIG. 1*a*. Therefore, the following description will be made with the aid of FIG. 1*a*. In case where both the gates GA and GK are not used, only one of them is provided. In most practical cases, only the cathode gate GK, which has a higher sensitivity, is provided and it is referred to as a control gate.

Figure 2A:
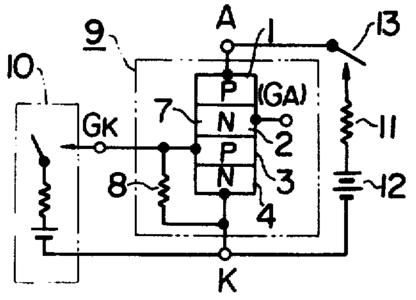
FIG. 2a PRIOR ART
Figure 2B:
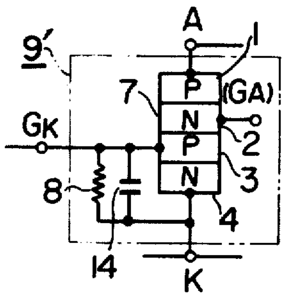
FIG. 2b PRIOR ART

FIGS. 2*a* and 2*b* show examples of conventional PNPN switching circuits provided with circuits to prevent erroneous firing, the PNPN switching circuits being ready for practical use. As seen in FIG. 2*a*, a PNPN switch 7, which has at least an anode A, a cathode K and a cathode gate GK, is shunted, between its cathode gate GK and cathode K, by a protection resistor 8. The function of the resistor 8 will be described later. The thus constructed PNPN switching circuit 9 is rendered conductive by instantaneously injecting current from a gate control circuit 10 into the gate GK so that current flows through a load 11 connected with the anode A. A current source for load current is a battery 12 in this circuit. Contact 13 is inserted between the anode A and the load 11, which serves to interrupt the load current, since once the load current starts flowing it tends to continue. Here, let it be assumed that the resistor 8 is removed from this circuit shown in FIG. 2*a*. Then, if the contact 13 is opened and again closed, the voltage between the anode A and the cathode K once vanishes and thereafter rapidly reaches that of the battery 12. During this transient period, transient current flows through the junction capacitances in the PNPN switch 7. The transient current plays the same role as the gating current and therefore causes the PNPN switch 7 to turn on erroneously without any gating current from the gate control circuit 10. This phenomenon is called rate effect, which must be taken into account with a circuit using a PNPN switch. When a voltage is applied between the anode A and the cathode K with the anode A and the cathode K maintained respectively at a positive and a negative potentials, as seen in FIG. 2*a*, a potential difference is established between the second layer 2 and the third layer 3 to cause transient current to charge the junction capacitance between the second and third layers 2 and 3. In order to prevent the resulting erroneous firing, the resistor 8 is provided, which diverts the transient current therethrough. With this artifice, indeed, the erroneous firing can be prevented, but the control current from the gate GK is also by-passed through the resistor 8 so that the gate sensitivity becomes very poor. For example, a PNPN switch for small power use can be controlled by a gate current of several tens of microamperes, without a protective resistor corresponding to the resistor 8, but, on the other hand, the PNPN switch with the protective resistor can only be turned on by a gate current in excess of several milliamperes. The difference is one to a few hundred times.

FIG. 2*b* shows a circuit which is the same as that shown in FIG. 2*a*, except the additional provision of a capacitor 14 shunting the protective resistor 8. The capacitor 14 serves to provide a small impedance path for the transient current. The capacity of the capacitor 14 must be sufficiently larger than that of the junction capacitance between the second and the third layers 2 and 3 so that it is very difficult to form the capacitor 14 by integrated circuit techniques.

The present invention has been made to eliminate such drawbacks as stated above and therefore uses a field effect transistor so as to prevent the erroneous firing without deteriorating the sensitivity to the gate control.

Figure 3:
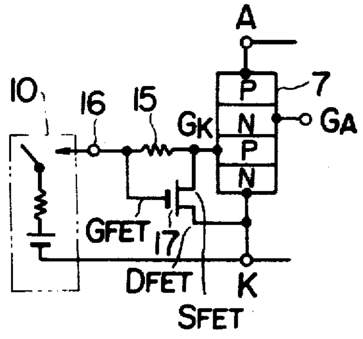
FIG. 3 shows a highly sensitive gate-controlled PNPN switching circuit as one embodiment of the present invention.

FIG. 3 shows a first embodiment of a highly sensitive gate-controlled PNPN switching circuit according to the present invention. In FIG. 3, the cathode gate GK of a PNPN switch 7 is connected with one end of a resistor 15 and the other end of the resistor 15 serves as a control terminal 16. In addition, a field effect transistor (hereinafter referred to as FET) 17 is provided, with its source $S_{FET}$, drain $D_{FET}$ and gate $G_{FET}$ connected respectively with the cathode gate GK, the cathode K and the control terminal 16. As the FET 17 is used an element which normally exhibits a low resistance but becomes highly resistive when the potential at the gate $G_{FET}$ comes to be higher than that at the source $S_{FET}$. The P-channel junction gate type FET or the P-channel depletion mode insulated gate FET fulfills the requirement for the element. The exclusive choice made here of an FET is due to the fact that the FET can be controlled only by voltage and there is no need for gate current.

Accordingly, when the control terminal 16 is opened, there is no voltage drop across the resistor 15 and the resistance between the source $S_{FET}$ and drain $D_{FET}$ of the FET 17 is small. Under this condition, the erroneous firing does not take place even if a step voltage is applied to the anode A of the PNPN switch 7. On the other hand, when current is injected through the control terminal 16, a voltage drop is caused across the resistor 15 so that the FET 17 becomes highly resistive or is cut off to cause the control current to flow into the cathode gate GK of the PNPN switch 7. This state is similar to the case where the resistor 8 is removed in the circuit shown in FIG. 2*a* and therefore the gate sensitivity depends solely on the property of the PNPN switch 7. Since the PNPN switch has a high sensitivity, the gating operation will be performed with high sensitivity.

Figure 4:
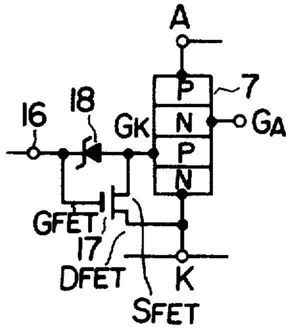
FIG. 4 shows a second embodiment of the present invention.

FIG. 4 shows a second embodiment of a highly sensitive gate-controlled PNPN switching circuit according to the present invention. In FIG. 4, only a difference is that the resistor 15 in FIG. 3 is replaced by a zener diode 18. The zener breakdown voltage of the diode 18 should be chosen to be higher than the pinch-off voltage of the FET 17 but the zener voltage can be so small that the FET 17 may be regarded as a high resistance. Further, a resistor or a capacitor can be connected between the cathode gate GK and the cathode K, this being considered as the second embodiment of the present invention plus a part of the conventional circuit shown in FIG. 2*b*. Thus, the circuit in FIG. 4 has almost the same property as that in FIG. 3, and the control of the potential at the gate of the FET is more stable in the circuit in FIG. 4 than in the circuit in FIG. 3. It is also possible to replace, in the circuit in FIG. 4, the zener diode 18 by a few diodes connected in series or by a transistor (in this case the breakdown voltage between the base and the emitter is used).

Figure 5:
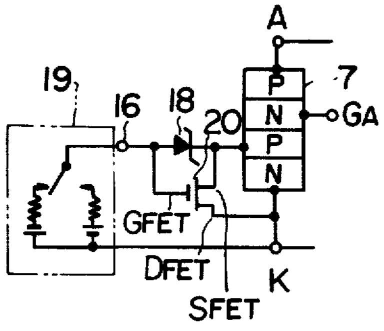
FIG. 5 shows a third embodiment of the present invention.

FIG. 5 shows a third embodiment of a highly sensitive gate-controlled PNPN switching circuit according to the present invention. The difference from the circuit shown in FIG. 4 is the reversed sense of the zener diode 18. In this circuit is used a control circuit 19 which normally maintains the potential of the control terminal 16 more negative than that of the cathode K and which injects current into the control terminal 16 only when the PNPN switch is turned on. Moreover, as the FET 20 is used an element which is conductive when the potential at the gate $G_{FET}$ is lower than that at the source $S_{FET}$ and which is cut off when the gate potential is equal to or larger than the source potential. A P-channel enhancement mode insulated gate FET is preferably used as such an element. The function of this circuit will be easily understood by analogy from the previous descriptions. Further, the substitution of the zener diode 18 and other alterations will also be analogized from the descriptions with FIGS. 3 and 4.

Figure 6:
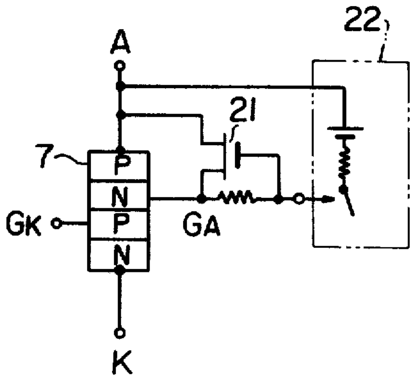
FIG. 6 shows a fourth embodiment of the present invention.

FIG. 6 shows a fourth embodiment of a highly sensitive gate-controlled PNPN switching circuit in which an FET 21 is connected at its drain and source with the anode A and the anode gate GA of a PNPN switch 7 and in which the PNPN switch 7 is fired by a gate control circuit 22 connected with the anode gate GA. In this circuit, the direction of the flow of the gating current is opposite to that in the circuit shown in FIG. 3, that is, the circuit in FIG. 6 is complementary to that in FIG. 3. And an N-channel junction gate type FET or an N-channel depletion mode insulated gate FET is used as the FET 21.

The circuits complementary to those shown in FIGS. 4 and 5 can also be embodied but they are here omitted since they can be easily analogized in view of the embodiment shown in FIG. 6.

Furthermore, if in the embodiments of the present invention the FET's 17, 20 and 21 are designed so that it may have a very small resistance between the source and the drain when it is conductive, then another effect can also be obtained such that the PNPN switch 7 is conductive only when current is being injected into the control terminal 16 while the PNPN switch 7 is cut off by interrupting or reversing the current into the control terminal. This effect is observed especially under such conditions that the holding current (the current which is self-held by the PNPN switch when the gate and the cathode are short-circuited by a small resistance) is increased to a great extent and that the load current is smaller than the holding current.

As described above, according to the present invention, there is obtained a highly sensitive gate-controlled PNPN switching circuit which has a simple structure using a field effect transistor and a voltage drop element and which can enjoy a high stability and a high sensitivity. The PNPN switching circuit according to the present invention find its special utility in the field where it is an utmost concern to decrease the control current, especially in the application in which the gate signal is continuously applied for the purpose specifically designed.

In the embodiment described above, the circuit according to the present invention has been explained as composed of discrete circuit elements but the circuit can be integrally formed in a chip of semiconductor such as silicon by the integrated circuit techniques.

What we claim is:

1. A highly sensitive gate-controlled PNPN switching circuit comprising a PNPN switch having a structure equivalent to a four-layer one consisting of P, N, P and N conductivity type layers; a field effect transistor and a voltage drop element, wherein electrodes are provided on the first (P) layer, the third (P) layer and the fourth (N) layer, the source and the drain of said field effect transistor are connected respectively with said third (P) and said fourth (N) layers of said PNPN switch, one end of said voltage drop element is connected with said third (P) layer of said PNPN switch, and the other end of said voltage drop element is connected with the gate of said field effect transistor, the junction point of said other end of said voltage drop element and said gate of said field effect transistor serving as the control gate terminal of said PNPN switching circuit.

2. A highly sensitive gate-controlled PNPN switching circuit as claimed in claim 1, wherein said voltage drop element is a resistor.

3. A highly sensitive gate-controlled PNPN switching circuit as claimed in claim 1, wherein said voltage drop element is a zener diode.

4. A highly sensitive gate-controlled PNPN switching circuit comprising a PNPN switch having a structure equivalent to a four-layer one consisting of P, N, P and N conductivity type layers; a field effect transistor and a voltage drop element, where electrodes are provided on the first (P) layer, the second (N) layer and the fourth (N) layer; the source and the drain of said field effect transistor are connected respectively with said second (N) and said first (P) layers, one end of said voltage drop element is connected with said second (N) layer, and the other end of said voltage drop element is connected with the gate of said field effect transistor, the junction point of other end of said voltage drop element and said gate of said field effect transistor serving as the control gate terminal of said PNPN switching circuit.

5. A highly sensitive gate-controlled PNPN switching circuit as claimed in claim 4, wherein said voltage drop element is a resistor.

6. A highly sensitive gate-controlled PNPN switching circuit as claimed in claim 4, wherein said voltage drop element is a zener diode.

7. A highly sensitive gate-controlled PNPN switching circuit comprising a PNPN switch having a structure equivalent to a four-layer one consisting of P, N, P and N conductivity type layers and having a characteristic similar to that of a thyristor; an FET whose drain and source are connected with one of the first and the fourth layers of said PNPN switch and its adjacent layer; a voltage drop element connected between said adjacent layer and the gate of said FET; and a control circuit connected between said one of said first and said fourth layers and said gate of said FET so as to render said PNPN switch on and off.

8. A highly sensitive gate-controlled PNPN switching circuit as claimed in claim 7, wherein said FET is a P-channel enhancement mode FET, the drain and the source of which are connected respectively with the fourth (N) layer and the third (P) layer of said PNPN switch, said voltage drop element is a zener diode which is connected in such a sense as to apply the zener breakdown voltage from the gate of said FET to said third layer of said PNPN switch, and said control circuit has a first power source to apply to said gate of said FET a negative potential with respect to said fourth (N) layer of said PNPN switch when the PNPN switch is cut off and a second power source to apply a positive potential to said gate of said FET only when said PNPN switch is turned on.

* * * * *